United States Patent
Kikuda (10) Patent No.: US 12,438,512 B2
(45) Date of Patent: Oct. 7, 2025

(54) FILTER DEVICE, AND RADIO-FREQUENCY FRONT END CIRCUIT PROVIDED WITH SAME

(71) Applicant: Murata Manufacturing Co., Ltd., Nagaokakyo (JP)

(72) Inventor: Masayuki Kikuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 211 days.

(21) Appl. No.: 18/376,006

(22) Filed: Oct. 3, 2023

(65) Prior Publication Data
US 2024/0030884 A1 Jan. 25, 2024

Related U.S. Application Data

(63) Continuation of application No. PCT/JP2022/005889, filed on Feb. 15, 2022.

(30) Foreign Application Priority Data

Apr. 5, 2021 (JP) .................. 2021-064115

(51) Int. Cl.
*H03H 7/01* (2006.01)
*H03H 7/09* (2006.01)

(52) U.S. Cl.
CPC ........ *H03H 7/0161* (2013.01); *H03H 7/0115* (2013.01); *H03H 7/09* (2013.01)

(58) Field of Classification Search
CPC .. H03H 7/0115; H03H 7/1758; H03H 7/0161; H03H 7/09; H03H 2001/0085; H01G 4/40; H01P 1/203; H01F 27/00
See application file for complete search history.

(56) References Cited

U.S. PATENT DOCUMENTS

2002/0057139 A1 5/2002 Matsumura et al.
2007/0120627 A1* 5/2007 Kundu ................ H01P 1/20345
333/204

(Continued)

FOREIGN PATENT DOCUMENTS

JP 2002-057543 A 2/2002
WO 2015/059964 A1 4/2015
(Continued)

OTHER PUBLICATIONS

Official Communication issued in International Patent Application No. PCT/JP2022/005889, mailed on Apr. 26, 2022.

*Primary Examiner* — Quan Tra
*Assistant Examiner* — Anh-Quan Tra
(74) *Attorney, Agent, or Firm* — Keating & Bennett, LLP (57) ABSTRACT

A filter device includes a main body, a ground terminal, ground electrodes, resonators, and a via. The ground electrodes are at different positions in a normal direction of the main body. The resonators are between the ground electrodes and electromagnetically coupled to each other. Each of the resonators includes two capacitor electrodes connected by a via. When the main body is viewed in plan view, each of the capacitor electrodes overlaps a respective one of the ground electrodes. The resonators include first resonators respectively connected to an input terminal and an output terminal, and second resonators between the first resonators. The via is between the second resonators when the main body is viewed in plan view from the normal direction, and is connected to the ground electrodes.

20 Claims, 9 Drawing Sheets

(56) References Cited

U.S. PATENT DOCUMENTS

| | | | |
|---|---|---|---|
| 2013/0076454 A1* | 3/2013 | Imamura | H03H 7/09 |
| | | | 333/176 |
| 2015/0303890 A1 | 10/2015 | Taniguchi | |
| 2016/0218690 A1* | 7/2016 | Imamura | H03H 7/0115 |
| 2018/0013395 A1 | 1/2018 | Asada | |
| 2019/0305745 A1 | 10/2019 | Taniguchi | |
| 2021/0126609 A1 | 4/2021 | Taniguchi | |
| 2022/0077835 A1* | 3/2022 | Motoyama | H01G 4/40 |

FOREIGN PATENT DOCUMENTS

| | | |
|---|---|---|
| WO | 2016/152211 A1 | 9/2016 |
| WO | 2018/100923 A1 | 6/2018 |
| WO | 2020/031838 A1 | 2/2020 |

* cited by examiner

FILTER DEVICE, AND RADIO-FREQUENCY FRONT END CIRCUIT PROVIDED WITH SAME

CROSS REFERENCE TO RELATED APPLICATIONS

This application claims the benefit of priority to Japanese Patent Application No. 2021-064115 filed on Apr. 5, 2021 and is a Continuation application of PCT Application No. PCT/JP2022/005889 filed on Feb. 15, 2022. The entire contents of each application are hereby incorporated herein by reference.

BACKGROUND OF THE INVENTION

1. Field of the Invention

The present disclosure relates to a filter device and a radio-frequency front end circuit including the same, and more particularly relates to techniques for improving characteristics of a filter device including a multilayer LC resonator.

2. Description of the Related Art

WO2018/100923 discloses a filter device including a plurality of stages of multilayer LC resonators.

Such a filter device as described above is used for, for example, communication devices such as mobile terminals typified by mobile phones or smartphones or personal computers having a communication function. Such communication devices are still highly required to be smaller and thinner, and therefore electronic parts used therefor are also required to be smaller.

A filter device is generally desired to allow a signal within a target passband to pass through it with low loss and to have high attenuation characteristics for a signal outside the passband. However, when the filter device is further reduced in size, sufficient attenuation characteristics outside the passband may not be achieved.

SUMMARY OF THE INVENTION

Preferred embodiments of the present invention improve the attenuation characteristics of a filter device including a multilayer LC resonator.

A preferred embodiment of the present disclosure is directed to a filter device including a main body, an input terminal, an output terminal, a ground terminal, a first ground electrode and a second ground electrode, and a plurality of resonators. The input terminal, the output terminal, and the ground terminal are provided in the main body. The first ground electrode and the second ground electrode are at different positions in a normal direction of the main body and are connected to the ground terminal. The plurality of resonators are between the first ground electrode and the second ground electrode in the normal direction and electromagnetically coupled to each other. Each of the plurality of resonators includes a first capacitor electrode, a second capacitor electrode, and a first via. When the main body is viewed in plan view from the normal direction, the first capacitor electrode at least partially overlaps the first ground electrode, and the second capacitor electrode at least partially overlaps the second ground electrode. The first via connects the first capacitor electrode and the second capacitor electrode. The plurality of resonators include a first resonator connected to the input terminal, a second resonator connected to the output terminal, and a third resonator and a fourth resonator in a region between the first resonator and the second resonator. When the main body is viewed in plan view from the normal direction, the filter device further includes a second via in a region between the third resonator and the fourth resonator and connected to the first ground electrode and the second ground electrode.

A filter device according to a preferred embodiment of the present disclosure includes four resonators, for example. When the filter device is viewed in plan view, a via (second via) connected to ground electrodes is in a region between two middle-stage resonators (third and fourth resonators). The degrees of coupling between the resonators can be adjusted by the second via. This makes it possible to improve the attenuation characteristics of a filter device including a multilayer resonator.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinbelow, preferred embodiments of the present disclosure will be described in detail with reference to the drawings. It should be noted that the same or equivalent components in the drawings are assigned with the same reference signs, and the description thereof will not be repeated.

Preferred Embodiment 1

Basic Configuration of Communication Device

Figure 1:
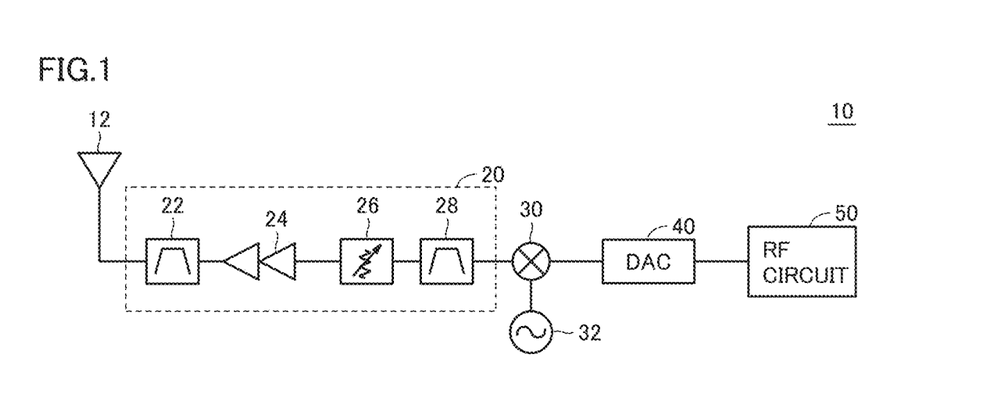
FIG. 1 is a block diagram of a communication device including a radio-frequency front end circuit to which a filter device according to Preferred Embodiment 1 of the present invention is applied.

FIG. 1 is a block diagram of a communication device 10 including a radio-frequency front end circuit 20 including a filter device according to Preferred Embodiment 1. Communication device 10 is, for example, a mobile terminal typified by a smartphone or a mobile phone base station.

Referring to FIG. 1, communication device 10 includes an antenna 12, radio-frequency front end circuit 20, a mixer 30, a local oscillator 32, a D/A converter (DAC) 40, and an RF circuit 50. Further, radio-frequency front end circuit 20 includes bandpass filters 22 and 28, an amplifier 24, and an attenuator 26. It should be noted that FIG. 1 illustrates a case where radio-frequency front end circuit 20 includes a transmitting circuit that transmits a radio-frequency signal from antenna 12, but radio-frequency front end circuit 20 may include a receiving circuit that receives a radio-frequency signal through antenna 12.

Communication device 10 up-converts a signal transmitted from RF circuit 50 into a radio-frequency signal and emits the radio-frequency signal from antenna 12. A modulated digital signal output from RF circuit 50 is converted into an analog signal by D/A converter 40. Mixer 30 up-converts the analog signal converted by D/A converter 40 into a radio-frequency signal by mixing with an oscillation signal from local oscillator 32. Bandpass filter 28 removes unwanted waves generated by the up-conversion to extract only a signal within a desired frequency band. Attenuator 26 adjusts the intensity of the signal. Amplifier 24 amplifies the power of the signal that has passed through attenuator 26 to a predetermined level. Bandpass filter 22 removes unwanted waves generated by the amplification process and allows only a signal component within a frequency band specified in communication standards to pass through it. The signal that has passed through bandpass filter 22 is emitted as a transmission signal from antenna 12.

As bandpass filters 22 and 28 in such communication device 10 as described above, a filter device according to one of the preferred embodiments of the present disclosure can be used.

Configuration of Filter Device

Hereinbelow, referring to FIG. 2 to FIG. 4, a detailed configuration of a filter device 100 of Preferred Embodiment 1 will be described.

Figure 2:
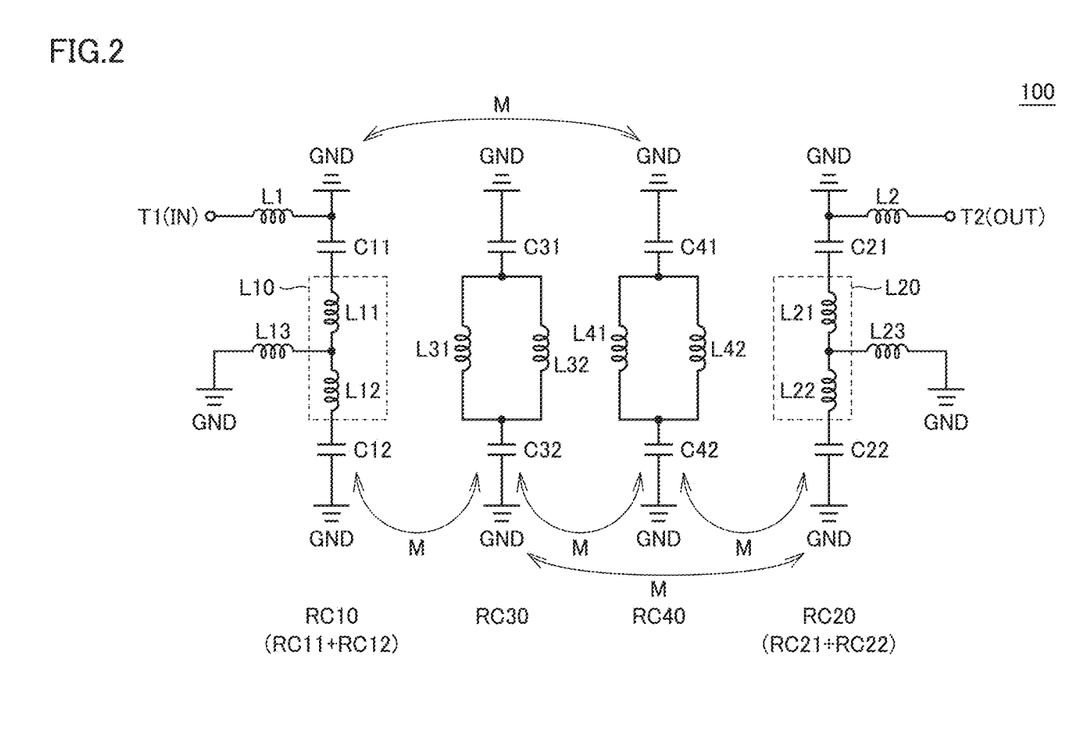
FIG. 2 is an equivalent circuit diagram of the filter device according to Preferred Embodiment 1 of the present invention.

FIG. 2 is an equivalent circuit diagram of filter device 100 according to Preferred Embodiment 1. Referring to FIG. 2, filter device 100 includes an input terminal T1(IN), an output terminal T2(OUT), inductors L1 and L2, and resonators RC10 to RC40. Each of resonators RC10 to RC40 is an LC resonator including an inductor and a capacitor. Resonator RC10 is connected to input terminal T1 through inductor L1. Resonator RC20 is connected to output terminal T2 through inductor L2. Resonators RC30 and RC40 are disposed between resonator RC10 and resonator RC20.

Resonator RC10 includes inductors L10 and L13 and capacitors C11 and C12. Inductor L10 includes inductors L11 and L12 connected in series. One end of inductor L11 is connected to a ground terminal GND through capacitor C11. The other end of inductor L12 is connected to ground terminal GND through capacitor C12. Inductor L13 is connected between ground terminal GND and a connection node between inductor L11 and inductor L12. Capacitor C11 is connected to input terminal T1 through inductor L1. Inductor L1 is connected to ground terminal GND.

Resonator RC20 includes inductors L20 and L23 and capacitors C21 and C22. Inductor L20 includes inductors L21 and L22 connected in series. One end of inductor L21 is connected to ground terminal GND through capacitor C21. The other end of inductor L22 is connected to ground terminal GND through capacitor C22. Inductor L23 is connected between ground terminal GND and a connection node between inductor L21 and inductor L22. Capacitor C21 is connected to output terminal T2 through inductor L2. Inductor L2 is connected to ground terminal GND.

Input terminal T1 and output terminal T2 are connected to ground terminal GND in their corresponding resonators, and therefore a radio-frequency signal propagating between the resonators is excited in TE (Transversal Electric) mode. This makes it possible to provide a filter device including resonators having a high Q value.

Resonator RC30 includes inductors L31 and L32 and capacitors C31 and C32. One end of inductor L31 is connected to ground terminal GND through capacitor C31. The other end of inductor L31 is connected to ground terminal GND through capacitor C32. Inductor L32 is connected in parallel to inductor L31. Inductors L31 and L32 are galvanically isolated from ground terminal GND by capacitors C31 and C32.

Resonator RC40 includes inductors L41 and L42 and capacitors C41 and C42. One end of inductor L41 is connected to ground terminal GND through capacitor C41. The other end of inductor L41 is connected to ground terminal GND through capacitor C42. Inductor L42 is connected in parallel to inductor L41. Inductors L41 and L42 are galvanically isolated from ground terminal GND by capacitors C41 and C42.

The resonators are coupled to each other by electromagnetic coupling M. As described above, filter device 100 has a configuration such that four stages of resonators electromagnetically coupled to each other are disposed between input terminal T1 and output terminal T2. A radio-frequency signal input to input terminal T1 is transmitted by electromagnetic coupling between resonators RC10 to RC40 and output from output terminal T2. At this time, only a signal within a frequency band determined by resonant frequencies of the respective resonators is transmitted to output terminal T2. That is, filter device 100 functions as a bandpass filter that allows a signal within a desired frequency band to pass through it by adjusting the resonant frequencies of the respective resonators.

Figure 3:
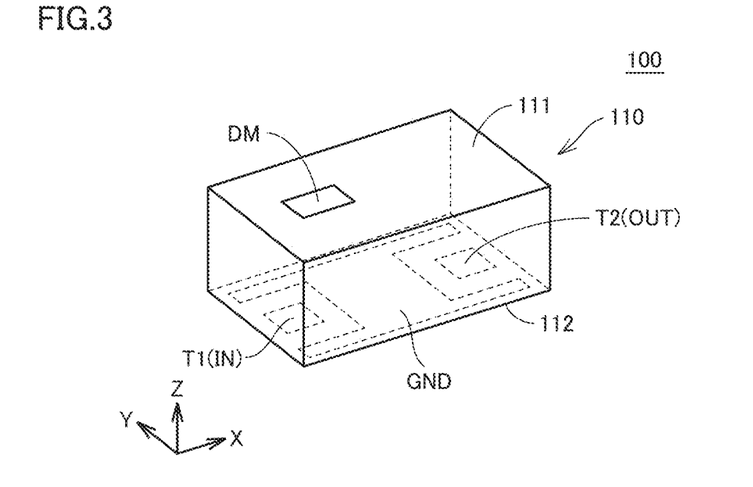
FIG. 3 is a perspective view showing the appearance of the filter device according to Preferred Embodiment 1 of the present invention.

FIG. 3 is a perspective view showing the appearance of filter device 100. FIG. 4 is an exploded perspective view showing an example of the structure of filter device 100.

Figure 4:
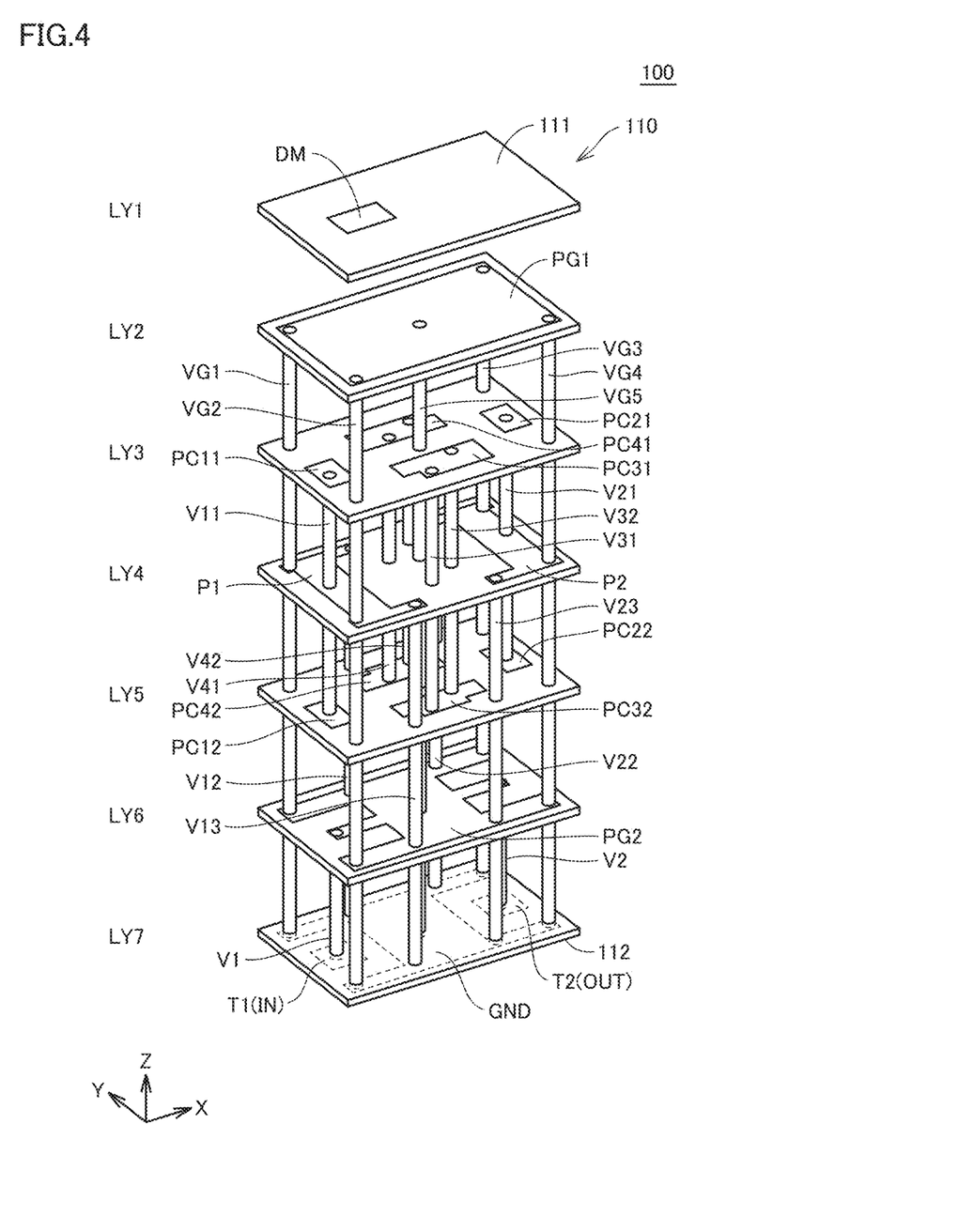
FIG. 4 is an exploded perspective view showing the internal structure of the filter device according to Preferred Embodiment 1 of the present invention.

Referring to FIG. 3 and FIG. 4, filter device 100 includes a main body 110 having a cuboid or almost cuboid shape and formed by stacking a plurality of dielectric layers LY1 to LY7 in a predetermined direction. The direction in which the plurality of dielectric layers LY1 to LY7 are stacked in main body 110 is defined as a lamination direction. Each of the dielectric layers of main body 110 is formed of, for example, ceramics such as low temperature co-fired ceramics (LTCC) or a resin. Inside main body 110, inductors and capacitors to provide an LC resonant circuit include a plurality of electrodes provided on the dielectric layers and a plurality of vias provided between the dielectric layers. It should be noted that the "via" herein refers to a conductor provided in the dielectric layers to connect the electrodes provided in the different dielectric layers. The via is formed of, for example, a conductive paste, plating, and/or a metallic pin.

It should be noted that in the following description, the lamination direction in main body 110 is defined as a "Z-axis direction", a direction normal to the Z-axis direction and parallel to the long side of main body 110 is defined as an "X-axis direction", and a direction parallel to the short side of main body 110 is defined as a "Y-axis direction". Further, in the following description, the positive direction side and negative direction side of the Z-axis direction in the drawings are sometimes referred to as upper side and lower side, respectively.

On a top surface 111 (dielectric layer LY1) of main body 110, a directional mark DM is disposed to identify the direction of filter device 100. On a bottom surface 112 (dielectric layer LY7) of main body 110, input terminal T1, output terminal T2, and ground terminal GND are disposed. Filter device 100 is connected to an external device using input terminal T1, output terminal T2, and ground terminal GND disposed on bottom surface 112 of main body 110.

Each of input terminal T1, output terminal T, and ground terminal GND is a plate-shaped electrode. Ground terminal GND has notches on the positive and negative direction sides of the X-axis direction so as to have an almost H shape. Input terminal T1 has a rectangular shape and is disposed inside the notch provided in ground terminal GND on the negative direction side of the X-axis direction. Output terminal T2 has a rectangular shape and is disposed inside the notch provided in ground terminal GND on the positive direction side of the X-axis direction.

On dielectric layer LY2 of main body 110, a ground electrode PG1 having a rectangular plate shape is disposed. Further, on dielectric layer LY6 of main body 110, a plate-shaped ground electrode PG2 is disposed. Ground electrodes PG1 and PG2 are connected to ground terminal GND provided on dielectric layer LY7 through vias VG1 to VG5. Vias VG1 to VG4 are respectively disposed at four corners of ground electrode PG1. Via VG5 is disposed in almost the center of ground electrode PG1.

Grounding electrode PG2 is connected to input terminal T1 on dielectric layer LY7 through via VG1. Further, ground electrode PG2 is connected to output terminal T2 on dielectric layer LY7 through via VG2. Inductors L1 and L2 shown in FIG. 2 are respectively constituted from via VG1 and via VG2.

As described above with reference to FIG. 2, filter device 100 includes four resonators RC10 to RC40. More specifically, resonator RC10 includes a via V11, capacitor electrodes PC11 and PC12, and a plate electrode P1. Resonator RC20 includes a via V21, capacitor electrodes PC21 and PC22, and a plate electrode P2. Resonator RC30 includes vias V31 and V32 and capacitor electrodes PC31 and PC32. Resonator RC40 includes vias V41 and V42 and capacitor electrodes PC41 and PC42.

Capacitor electrode PC11 of resonator RC10 is a rectangular plate electrode and is provided on dielectric layer LY3. When main body 110 is viewed in plan view from the normal direction (Z-axis direction), a portion of capacitor electrode PC11 overlaps ground electrode PG1 provided on dielectric layer LY2. Capacitor electrode PC11 and ground electrode PG1 define capacitor C11 shown in FIG. 2. Capacitor electrode PC12 is a rectangular plate electrode and is provided on dielectric layer LY5. When main body 110 is viewed in plan view from the normal direction, a portion of capacitor electrode PC12 overlaps ground electrode PG2 provided on dielectric layer LY6. Capacitor electrode PC12 and ground electrode PG2 define capacitor C12 shown in FIG. 2.

Capacitor electrode PC11 is connected to capacitor electrode PC12 through via V11. Via V11 is also connected to plate electrode P1 provided on dielectric layer LY4. Plate electrode P1 has an almost C shape and is connected to ground electrodes PG1 and PG2 and ground terminal GND through vias VG1 and VG2. The ends of protrusions of the almost C-shaped plate electrode P1 are respectively connected to vias V12 and V13. Vias V12 and V13 are connected to ground electrode PG2 on dielectric layer LY6 and ground terminal GND on dielectric layer LY7. Via V11 defines inductor L10 shown in FIG. 2. Plate electrode P1 and vias VG1, VG2, V12, and V13 define inductor L13 shown in FIG. 2.

Capacitor electrode PC21 of resonator RC20 is a rectangular plate electrode and is provided on dielectric layer LY3. When main body 110 is viewed in plan view from the normal direction, a portion of capacitor electrode PC21 overlaps ground electrode PG1 provided on dielectric layer LY2. Capacitor electrode PC21 and ground electrode PG1 define capacitor C21 shown in FIG. 2. Capacitor electrode PC22 is a rectangular plate electrode and is provided on dielectric layer LY5. When main body 110 is viewed in plan view from the normal direction, a portion of capacitor electrode PC22 overlaps ground electrode PG2 provided on dielectric layer LY6. Capacitor electrode PC22 and ground electrode PG2 define capacitor C22 shown in FIG. 2.

Capacitor electrode PC21 is connected to capacitor electrode PC22 through via V21. Via V21 is connected to plate electrode P2 provided on dielectric layer LY4. Plate electrode P2 has an almost C shape and is connected to ground electrodes PG1 and PG2 and ground terminal GND through vias VG1 and VG2. The ends of protrusions of the almost C-shaped plate electrode P2 are respectively connected to vias V22 and V23. Vias V22 and V23 are connected to ground electrode PG2 on dielectric layer LY6 and ground terminal GND on dielectric layer LY7. Via V21 defines inductor L20 shown in FIG. 2. Plate electrode P2 and vias VG1, VG2, V22, and V23 define inductor L23 shown in FIG. 2.

Providing plate electrodes P1 and P2 and connecting input and output-side resonators RC10 and RC20 to the ground terminal have the effect of generating an attenuation pole on a lower frequency side relative to a passband. When plate electrodes P1 and P2 are connected to ground electrodes PG1 and PG2 and ground terminal GND, the low frequency-side impedance of resonators RC10 and RC20 is reduced so that an attenuation pole is generated on a lower frequency side relative to a passband by the inductance of vias V11 and V21 connected in series to capacitor electrodes PC12 and PC22.

Capacitor electrode PC31 of resonator RC30 has a plate shape and is disposed in a region between capacitor electrode PC11 and capacitor electrode PC21 on dielectric layer LY3. When main body 110 is viewed in plan view from the normal direction, a portion of capacitor electrode PC31 overlaps ground electrode PG1 disposed on dielectric layer LY2. Capacitor electrode PC31 and ground electrode PG1 constitute capacitor C31 shown in FIG. 2. Capacitor electrode PC32 has a plate shape and is provided on dielectric layer LY5. When main body 110 is viewed in plan view from the normal direction, a portion of capacitor electrode PC32 overlaps ground electrode PG2 provided on dielectric layer LY6. Capacitor electrode PC32 and ground electrode PG2 define capacitor C32 shown in FIG. 2. Capacitor electrode PC31 is connected to capacitor electrode PC32 through vias V31 and V32.

Capacitor electrode PC41 of resonator RC40 has a plate shape and is disposed in a region between capacitor electrode PC11 and capacitor electrode PC21 on dielectric layer LY3. Capacitor electrode PC41 is disposed on dielectric layer LY3 so as to be opposed to capacitor electrode PC31 of resonator RC30 in the Y-axis direction. When main body 110 is viewed in plan view from the normal direction, a portion of capacitor electrode PC41 overlaps ground electrode PG1 disposed on dielectric layer LY2. Capacitor electrode PC41 and ground electrode PG1 define capacitor C41 shown in FIG. 2. Capacitor electrode PC42 has a plate shape and is disposed on dielectric layer LY5 so as to be opposed to capacitor electrode PC32 of resonator RC30 in the Y-axis direction. When main body 110 is viewed in plan view from the normal direction, a portion of capacitor electrode PC42 overlaps ground electrode PG2 disposed on dielectric layer LY6. Capacitor electrode PC42 and ground electrode PG2 define capacitor C42 shown in FIG. 2. Capacitor electrode PC41 is connected to capacitor electrode PC42 through vias V41 and V42.

Vias VG1, V12, V22, and VG3 are disposed along the side surface of main body 110 in the X-axis direction. Vias VG2, V13, V23, and VG4 are disposed along the side surface of main body 110 in the X-axis direction. In other words, vias VG1 to VG4, V12, V13, V22, and V23 are disposed along the outer periphery of main body 110.

When main body 110 is viewed in plan view from the lamination direction, via VG5 is disposed in a region between capacitor electrode PC11 of resonator RC10 and capacitor electrode PC21 of resonator RC20 and also in a region between capacitor electrode PC31 of resonator RC30 and capacitor electrode PC41 of resonator RC40.

Figure 5:
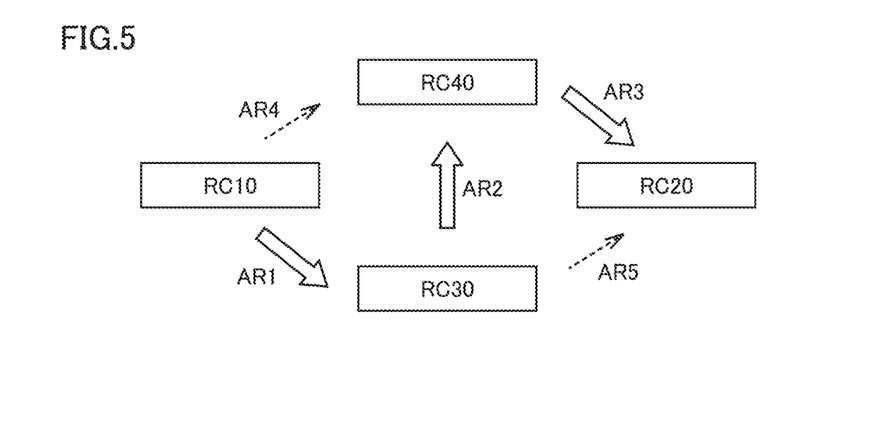
FIG. 5 is a diagram for illustrating a coupling state between resonators in the filter device according to Preferred Embodiment 1 of the present invention.

FIG. 5 is a diagram for illustrating the coupling state between the resonators in filter device 100. In filter device 100, a radio-frequency signal input to input terminal T1 is transmitted to resonator RC10, resonator RC30, resonator RC40, and resonator RC20 in this order through a main pathway indicated by arrows AR1, AR2, and AR3 in FIG. 5 and is output from output terminal T2.

The radio-frequency signal input to input terminal T1 is also transmitted from resonator RC10 to resonator RC40 as indicated by a dashed arrow AR4 in FIG. 5. Further, the radio-frequency signal transmitted to resonator RC30 is transmitted also to resonator RC20 as indicated by a dashed arrow AR5 in FIG. 5. Due to such bypassing of a portion of the main pathway, that is, so-called cross coupling, an attenuation pole is generated.

When such a filter device including a plurality of resonators is reduced in size, gaps between the resonators are reduced so that coupling between the resonators becomes strong. This may result in a reduction in isolation between the input terminal and the output terminal and/or a deterioration in attenuation characteristics in a stop band.

In filter device 100 of Preferred Embodiment 1, via VG5 connected to ground terminal GND is disposed in a region between resonator RC10 and resonator RC20 and also in a region between resonator RC30 and resonator RC40. This makes it possible to achieve isolation between input terminal T1 and output terminal T2. Further, the degree of coupling between resonator RC30 and resonator RC40 is adjusted by the positions of vias V31, V32, V41, and V42 included in resonators RC30 and RC40 and the position of via VG5.

Figure 6:
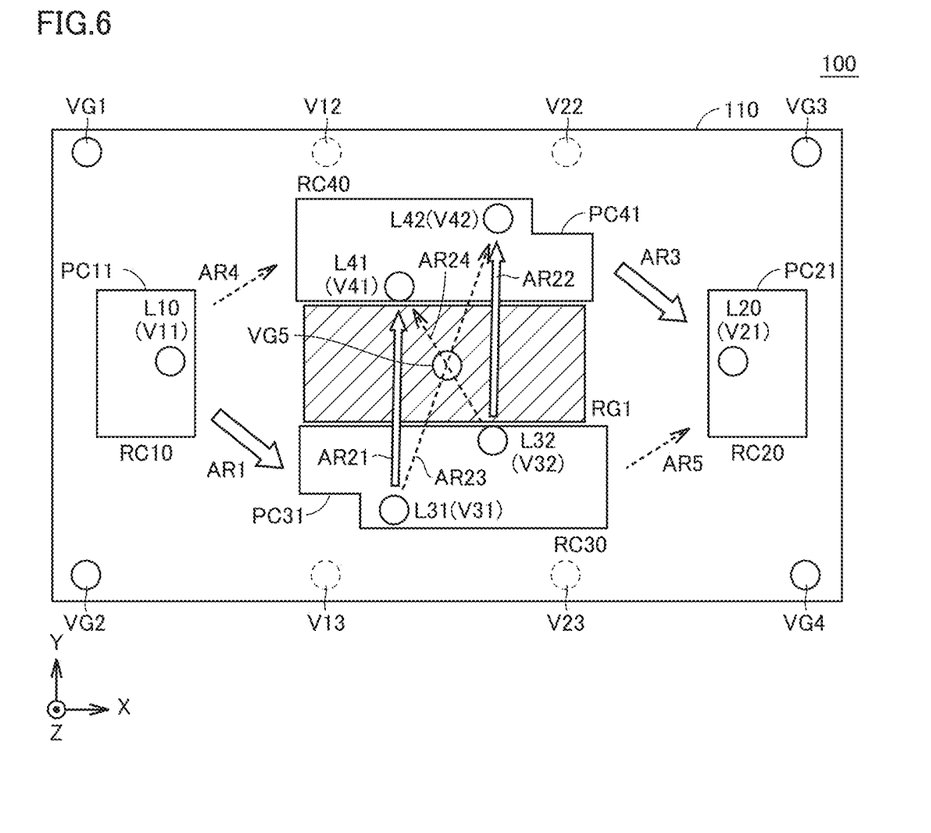
FIG. 6 is a diagram for illustrating a coupling state between resonators in the filter device according to Preferred Embodiment 1 of the present invention.

FIG. 6 is a diagram for illustrating the coupling state between resonator RC30 and resonator RC40 in filter device 100 in more detail. FIG. 6 is a plan view of dielectric layer LY3 shown in FIG. 4. Referring to FIG. 6, as described above, via VG5 is disposed in a region between capacitor electrode PC31 of resonator RC30 and capacitor electrode PC41 of resonator RC40.

In resonator RC30, the position of via V31 in the X-axis direction is on the negative direction side relative to the position of via VG5, and the position of via V32 in the X-axis direction is on the positive direction side relative to the position of via VG5. In resonator RC40, the position of via V41 in the X-axis direction is on the negative direction side relative to the position of via VG5, and the position of via V42 in the X-axis direction is on the positive direction side relative to the position of via VG5.

In filter device 100, via VG5 is disposed in a region where a pathway connecting via V31 and via V42 and a pathway connecting via V32 and via V41 intersect. When via VG5 is disposed in such a manner, coupling between via V31 and via V42 indicated by a dashed arrow AR23 in FIG. 6 and coupling between via V32 and via V41 indicated by a dashed arrow AR24 in FIG. 6 are blocked or weakened. On the other hand, coupling (arrow AR21) between via V31 and via V41 and coupling (arrow AR22) between via V32 and via V42 are not inhibited by via VG5. That is, coupling between resonator RC30 and resonator RC40 is weakened as compared to a case where via VG5 is not disposed. Therefore, when a distance between resonators RC30 and RC40 is reduced by downsizing, coupling between resonator RC30 and resonator RC40 is adjusted by via VG5 so that a desired attenuation in a stop band can be achieved.

Further, via VG5 is disposed on a pathway connecting via V11 of resonator RC10 and via V21 of resonator RC20. Therefore, coupling between resonator RC10 and resonator RC20 is blocked. This makes it possible to achieve isolation between resonator RC10 and resonator RC20.

Figure 9:
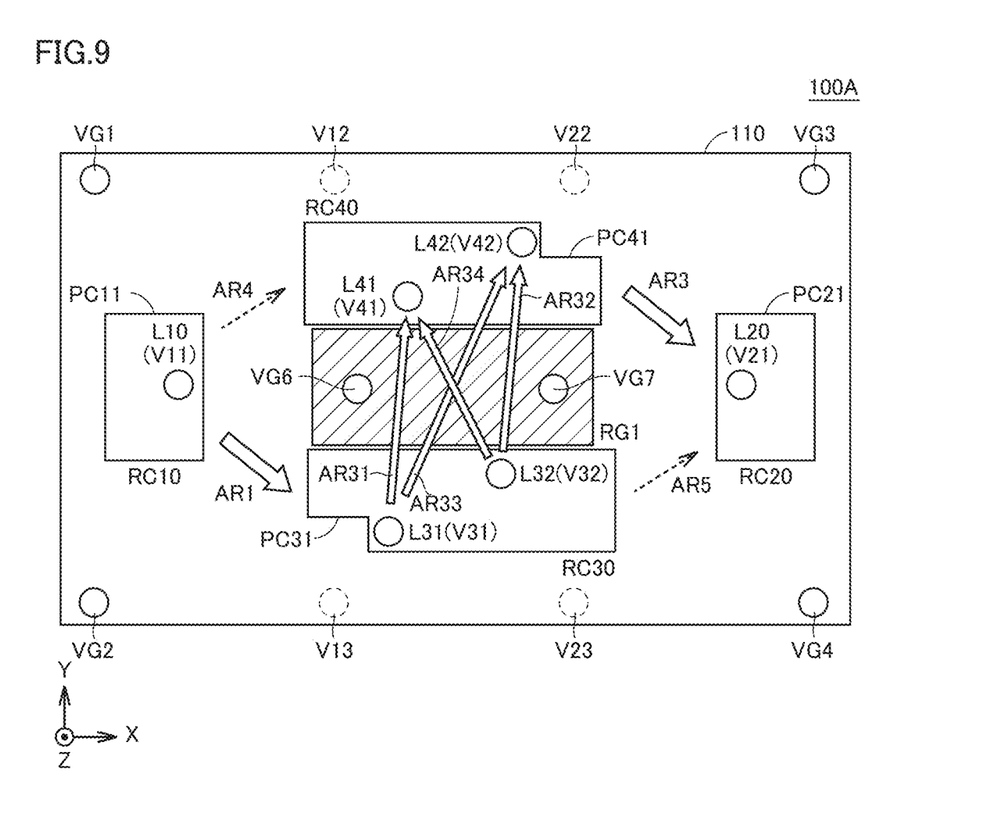
FIG. 9 is a diagram for illustrating a coupling state between resonators in the filter device according to Preferred Embodiment 2 of the present invention.

It should be noted that it is not always necessary to dispose via VG5 in the center of main body 110, and via VG5 is disposed in any position in a hatched region RG1 shown in FIG. 9 depending on desired degrees of coupling between the resonators.

Bandpass Characteristics

Figure 7:
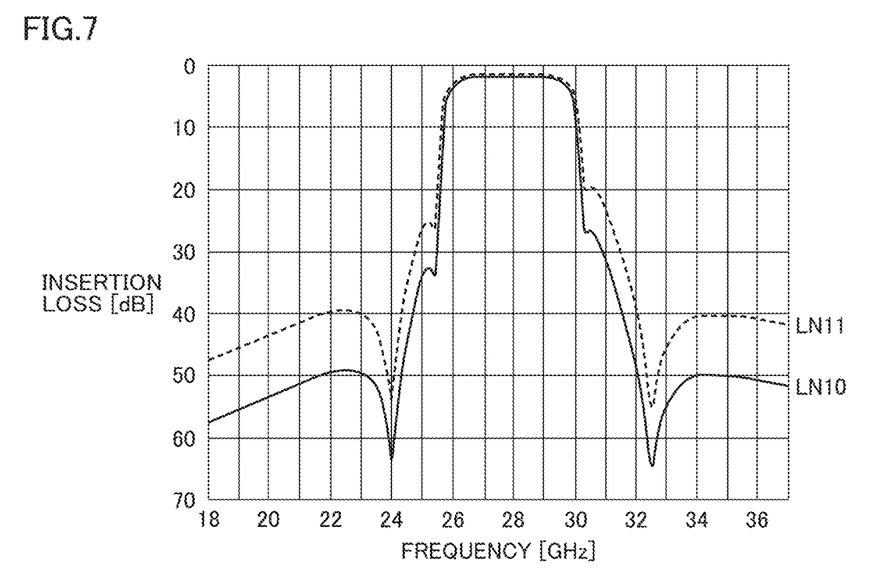
FIG. 7 is a diagram showing the bandpass characteristics of the filter device according to Preferred Embodiment 1 of the present invention and the bandpass characteristics of a filter device according to a comparative example.

FIG. 7 is a diagram showing the bandpass characteristics of filter device 100 of Preferred Embodiment 1 and the bandpass characteristics of a filter device of a comparative example not provided with via VG5. In FIG. 7, the horizontal axis represents a frequency and the vertical axis represents an insertion loss. In FIG. 7, a solid line LN10 indicates the case of filter device 100 of Preferred Embodiment 1 and a dashed line LN11 indicates the case of the filter device of the comparative example.

As shown in FIG. 7, in the case of filter device 100 of Preferred Embodiment 1, an attenuation at each attenuation pole is larger than that of the comparative example, and an attenuation of about 50 dB or more can be achieved on a lower frequency side relative to the attenuation pole at about 24 GHz and on a higher frequency side relative to the attenuation pole at about 32.5 GHz, for example.

As described above, in the filter device configured to include a plurality of multilayer LC resonators, since the via connected to the ground terminal is disposed between the resonators, the degrees of coupling between the resonators are adjusted. Therefore, even when the distances between the resonators are reduced by downsizing of the filter device, an increase in the degrees of coupling between the resonators is prevented. This makes it possible to achieve isolation between the input and output terminals in the filter device and prevent a deterioration in attenuation characteristics.

It should be noted that "ground electrodes PG1 and PG2" in Preferred Embodiment 1 respectively correspond to "first ground electrode" and "second ground electrode" in the present disclosure. Each of "capacitor electrodes PC11, PC21, PC31, and PC41" in Preferred Embodiment 1 corresponds to "first capacitor electrode" in the present disclosure. Each of "capacitor electrodes PC12, PC22, PC32, and PC42" in Preferred Embodiment 1 corresponds to "second capacitor electrode" in the present disclosure. Each of "vias V11, V21, V31, V32, V41, and V42" in Preferred Embodiment 1 corresponds to "first via" in the present disclosure. "Resonators RC10, RC20, RC30, and RC40" in Preferred Embodiment 1 respectively correspond to "first resonator" to "fourth resonator" in the present disclosure. "Via VG5" in Preferred Embodiment 1 corresponds to "second via" in the present disclosure. "Vias V31, V32, V41, and V42" in Preferred Embodiment 1 respectively correspond to "first conductor" to "fourth conductor" in the present disclosure. Each of "vias VG1, VG2, VG3, VG4, V12, V13, V22, and V23" in Preferred Embodiment 1 corresponds to "third via" in the present disclosure.

Preferred Embodiment 2

Preferred Embodiment 2 will be described with reference to a case where a plurality of vias connected to a ground terminal are disposed in a region between resonators.

Figure 8:
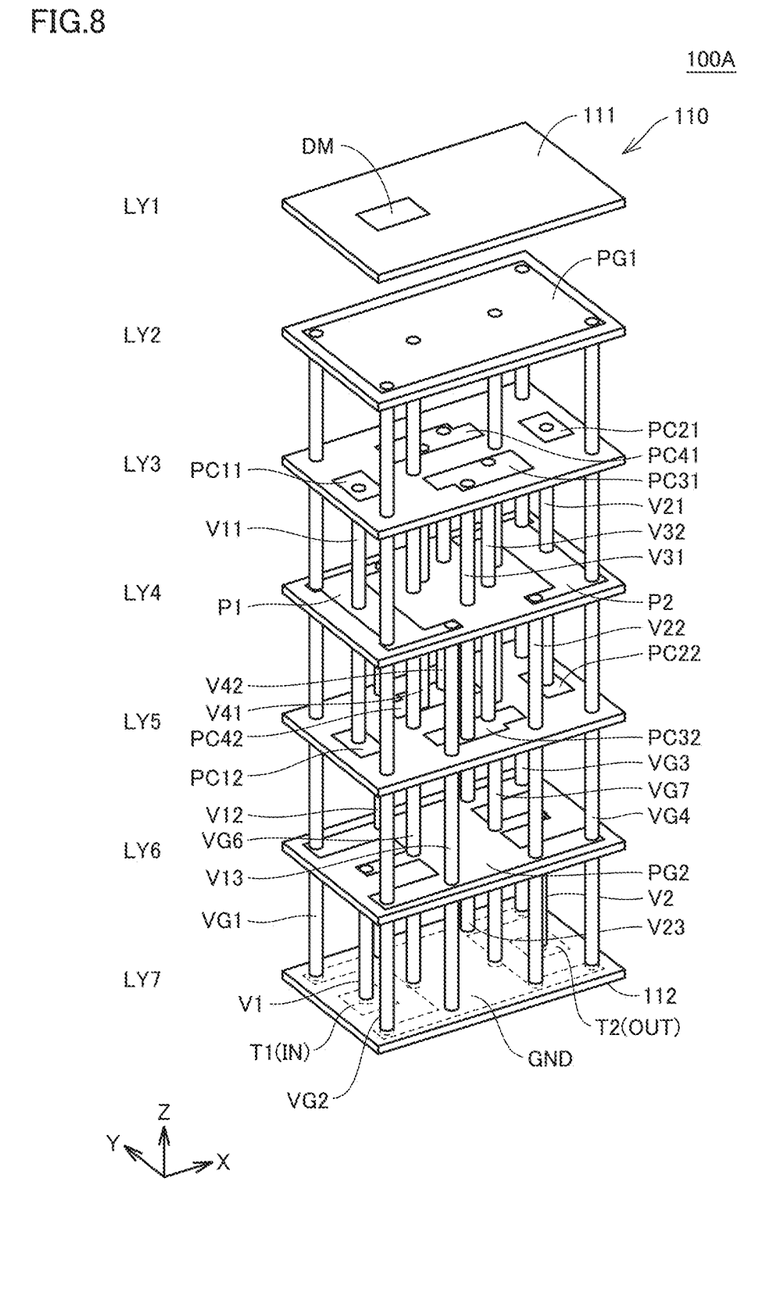
FIG. 8 is an exploded perspective view showing the structure of a filter device according to Preferred Embodiment 2 of the present invention.

FIG. 8 is an exploded perspective view showing the structure of a filter device 100A according to Preferred Embodiment 2. Filter device 100A is different from filter device 100 of Preferred Embodiment 1 in that two vias VG6 and VG7 are disposed in a region between resonator RC30 and resonator RC40 instead of via VG5. It should be noted that the other configurations shown in FIG. 8 are the same as those of filter device 100 shown in FIG. 4. Description of components shown in FIG. 8 that are the same as those shown in FIG. 4 will not be repeated.

Referring to FIG. 8, via VG6 is disposed in an input terminal T1-side offset position relative to the center of the dielectric layer in a region between resonator RC30 and resonator RC40. Via VG7 is disposed in an output terminal T2-side offset position relative to the center of the dielectric layer in a region between resonator RC30 and resonator RC40. Each of vias VG6 and VG7 is connected to ground electrodes PG1 and PG2 and ground terminal GND.

FIG. 9 is a diagram for illustrating the coupling state between resonator RC30 and resonator RC40 in filter device 100A. FIG. 9 is a plan view of dielectric layer LY3 shown in FIG. 8.

Referring to FIG. 9, vias VG6 and VG7 are disposed in a region between capacitor electrode PC31 of resonator RC30 and capacitor electrode PC41 of resonator RC40. The position of via VG6 in the X-axis direction is on the negative direction side relative to vias V31, V32, V41, and V42. The position of via VG7 in the X-axis direction is on the positive direction side relative to vias V31, V32, V41, and V42. Therefore, in an example of filter device 100A, coupling between resonator RC30 and resonator RC40, that is, coupling (arrow AR31) between via V31 and via V41, coupling (arrow AR32) between via V32 and via V41, coupling (arrow AR33) between via V31 and via V42, and coupling (arrow AR34) between via V32 and via V42 are hardly influenced by vias VG6 and VG7.

On the other hand, as for resonator RC10 and resonator RC20, coupling between resonator RC10 and resonator RC20 can further be reduced because two vias VG6 and VG7 are present between via V11 and via V21. This makes it possible to improve isolation between the input and output terminals.

It should be noted that the placement of vias VG6 and VG7 in FIG. 9 hardly influences coupling between resonator RC30 and resonator RC40, but the degrees of coupling between vias V31, V32, V41, and V42 are weakened by shifting the positions of vias VG6 and VG7 shown in FIG. 9 toward the center. This makes it possible to increase an attenuation in a stop band. It should be noted that the positions of vias VG6 and VG7 are appropriately selected according to desired bandpass characteristics (an insertion loss in a passband, an attenuation in a stop band).

As described above, also in the case of such a configuration that a plurality of vias connected to the ground terminal are disposed between the resonators, isolation between the input and output terminals can be achieved and a deterioration in attenuation characteristics can be prevented by adjusting the placement of the vias. By providing a plurality of vias, the state of coupling between the resonators is more finely adjusted.

It should be noted that "vias VG6 and VG7" in Preferred Embodiment 2 correspond to "second via" in the present disclosure.

Preferred Embodiment 3

Figure 10:
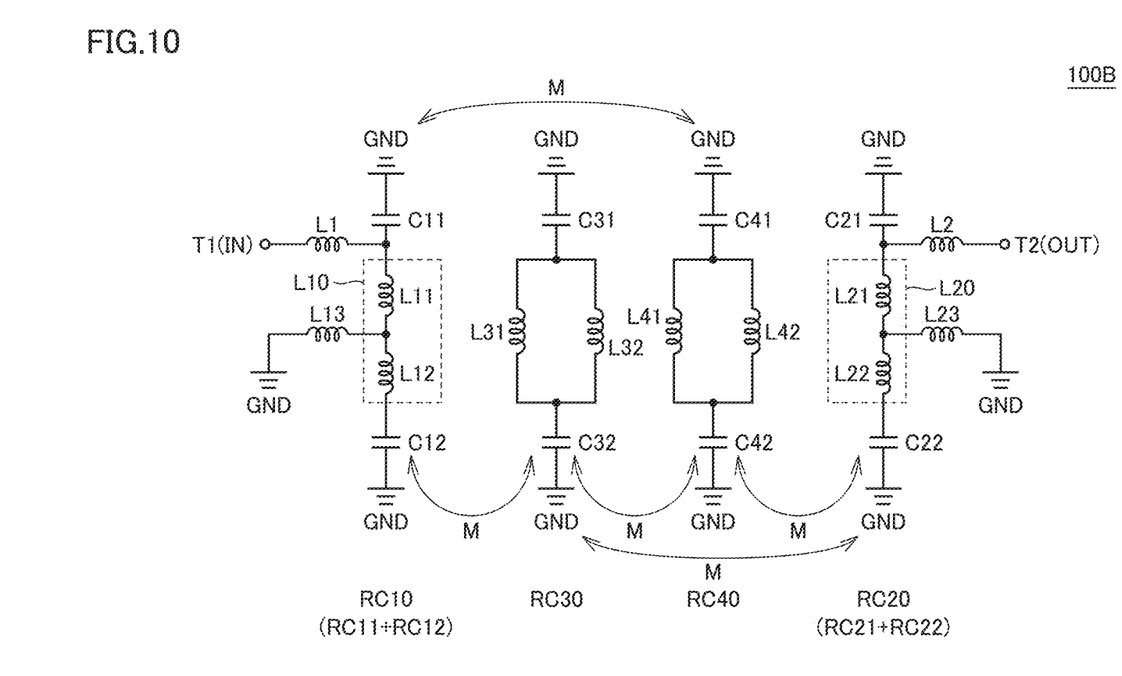
FIG. 10 is an equivalent circuit diagram of a filter device according to Preferred Embodiment 3 of the present invention.

FIG. 10 is an equivalent circuit diagram of a filter device 100B according to Preferred Embodiment 3. Filter device 100B of Preferred Embodiment 3 is different from filter device 100 of Preferred Embodiment 1 in the connecting position of input terminal T1 in resonator RC10 and the connecting position of output terminal T2 in resonator RC20. It should be noted that description of components of filter device 100B that are the same as those of filter device 100 will not be repeated.

More specifically, in filter device 100B, inductor L1 connected to input terminal T1 is connected to a connection node between capacitor C11 and inductor L10 in resonator RC10. Inductor L2 connected to output terminal T2 is connected to a connection node between capacitor C21 and inductor L20 in resonator RC20.

In this case, via V1 connected to input terminal T1 in FIG. 4 is connected not to ground electrode PG2 but to capacitor electrode PC12. Via V2 connected to output terminal T2 is connected not to ground electrode PG2 but to capacitor electrode PC22.

Also in the case of such a configuration, the degrees of coupling between the resonators are adjusted because the via connected to ground terminal GND is disposed in a region between resonator RC10 and resonator RC20 and also in a region between resonator RC30 and resonator RC40. This makes it possible to achieve isolation between the input and output terminals in the filter device and prevent a deterioration in attenuation characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A filter device comprising:
a main body;
an input terminal, an output terminal, and a ground terminal in the main body;
a first ground electrode and a second ground electrode at different positions in a normal direction of the main body and connected to the ground terminal; and
a plurality of resonators between the first ground electrode and the second ground electrode in the normal direction and electromagnetically coupled to each other; wherein
each of the plurality of resonators includes:
a first capacitor electrode that at least partially overlaps the first ground electrode when the main body is viewed in plan view from the normal direction;

a second capacitor electrode that at least partially overlaps the second ground electrode when the main body is viewed in plan view from the normal direction; and a first via that connects the first capacitor electrode and the second capacitor electrode; and the plurality of resonators include:

a first resonator connected to the input terminal;

a second resonator connected to the output terminal; and a third resonator and a fourth resonator in a region between the first resonator and the second resonator;

the filter device further comprising a second via in a region between the third resonator and the fourth resonator when the main body is viewed in plan view from the normal direction and connected to the first ground electrode and the second ground electrode.

2. The filter device according to claim 1, wherein the second via is in a region where the first ground electrode and the second ground electrode are overlapped when the main body is viewed in plan view from the normal direction.

3. The filter device according to claim 1, wherein when the main body is viewed in plan view from the normal direction, the second via is on a pathway connecting the first via of the first resonator and the first via of the second resonator.

4. The filter device according to claim 1, wherein the first via of the third resonator includes a first conductor and a second conductor;

the first via of the fourth resonator includes a third conductor and a fourth conductor; and the second via is in a region where a pathway connecting the first conductor and the fourth conductor and a pathway connecting the second conductor and the third conductor intersect.

5. The filter device according to claim 1, wherein the first via of the third resonator includes a first conductor and a second conductor;

the first via of the fourth resonator includes a third conductor and a fourth conductor; and the second via includes a fifth conductor and a sixth conductor.

6. The filter device according to claim 1, wherein an inductor included in the first resonator and an inductor included in the second resonator are connected to the ground terminal.

7. The filter device according to claim 1, wherein the input terminal and the output terminal are connected to the ground terminal.

8. The filter device according to claim 1, further comprising a plurality of third vias located along an outer periphery of the main body and electrically connected to the ground terminal in the main body.

9. The filter device according to claim 1, wherein four stages of resonators are electromagnetically coupled to each other between the input terminal and the output terminal.

10. The filter device according to claim 1, wherein the filter device is a bandpass filter.

11. The filter device according to claim 1, wherein the main body includes dielectric layers and electrodes defining capacitors and inductors.

12. The filter device according to claim 11, wherein the main body further includes vias connecting the electrodes to define LC resonant circuits.

13. A radio-frequency front end circuit comprising the filter device according to claim 1.

14. The radio-frequency front end circuit according to claim 13, wherein the filter device defines a bandpass filter.

15. The radio-frequency front end circuit according to claim 13, wherein the second via is in a region where the first ground electrode and the second ground electrode are overlapped when the main body is viewed in plan view from the normal direction.

16. The radio-frequency front end circuit according to claim 13, wherein when the main body is viewed in plan view from the normal direction, the second via is on a pathway connecting the first via of the first resonator and the first via of the second resonator.

17. The radio-frequency front end circuit according to claim 13, wherein the first via of the third resonator includes a first conductor and a second conductor;

the first via of the fourth resonator includes a third conductor and a fourth conductor; and the second via is in a region where a pathway connecting the first conductor and the fourth conductor and a pathway connecting the second conductor and the third conductor intersect.

18. The radio-frequency front end circuit according to claim 13, wherein the first via of the third resonator includes a first conductor and a second conductor;

the first via of the fourth resonator includes a third conductor and a fourth conductor; and the second via includes a fifth conductor and a sixth conductor.

19. A communication device comprising the radio-frequency front end circuit according to claim 13.

20. The communication device according to claim 19, wherein the communication device is a mobile terminal.

* * * * *